US012713928B2

(12) United States Patent
Goh et al.

(10) Patent No.: US 12,713,928 B2
(45) Date of Patent: Aug. 18, 2026

(54) EMI CAGE FOR MICROSTRIP ROUTING VIA DUAL LAYER UNDERFILL CONCEPT

(71) Applicant: Intel Corporation, Santa Clara, CA (US)

(72) Inventors: Eng Huat Goh, Ayer Itam (MY); Jiun Hann Sir, Gelugor (MY); Chee Kheong Yoon, Bayan Lepas (MY); Telesphor Kamgaing, Chandler, AZ (US); Min Suet Lim, Gelugor (MY); Kavitha Nagarajan, Bangalore (IN); Chu Aun Lim, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 270 days.

(21) Appl. No.: 17/833,580

(22) Filed: Jun. 6, 2022

(65) Prior Publication Data

US 2023/0395524 A1 Dec. 7, 2023

(51) Int. Cl.

| | |
|---|---|
| ***H10W 42/20*** | (2026.01) |
| ***H10W 44/20*** | (2026.01) |
| ***H10W 70/65*** | (2026.01) |
| ***H10W 70/685*** | (2026.01) |
| *H10W 72/00* | (2026.01) |

(Continued)

(52) U.S. Cl.

CPC ........... *H10W 42/20* (2026.01); *H10W 44/20* (2026.01); *H10W 70/685* (2026.01); *H10W 44/216* (2026.01); *H10W 44/248* (2026.01); *H10W 70/65* (2026.01); *H10W 72/01361* (2026.01); *H10W 72/324* (2026.01); *H10W 72/334* (2026.01); *H10W 72/354* (2026.01); *H10W 72/383* (2026.01); *H10W 72/387* (2026.01); *H10W 74/15* (2026.01); *H10W 90/401* (2026.01); *H10W 90/701* (2026.01); *H10W 90/724* (2026.01); *H10W 90/734* (2026.01)

(58) Field of Classification Search

CPC ....... H01L 23/552; H01L 23/66; H01L 24/16; H01L 24/27; H01L 24/29; H01L 24/32; H01L 24/73; H01L 2223/6627; H01L 2223/6677; H01L 2224/26155; H01L 2224/26175; H10W 42/20; H10W 72/383; H10W 72/387; H10W 74/15; H10W 44/20; H10W 44/216; H10W 44/248; H10W 90/724; H10W 90/734; H10W 70/685; H10W 72/20; H10W 74/012

See application file for complete search history.

(56) References Cited

U.S. PATENT DOCUMENTS

| | | | | |
|---|---|---|---|---|
| 10,438,863 | B1 * | 10/2019 | Boja | H01L 21/52 |
| 2005/0121806 | A1 * | 6/2005 | Sangiorgi | H05K 3/305 156/314 |

(Continued)

*Primary Examiner* — Khiem D Nguyen

(74) *Attorney, Agent, or Firm* — Schwabe, Williamson & Wyatt P.C.

(57) ABSTRACT

Embodiments disclosed herein include electronic packages. In an embodiment, an electronic package comprises a package substrate, and a die coupled to the package substrate. In an embodiment, a stiffener is around the die and over the package substrate. In an embodiment, an electrically non-conductive underfill is around first level interconnects (FLIs) between the package substrate and the die. In an embodiment, an electrically conductive layer is around the non-conductive underfill.

22 Claims, 7 Drawing Sheets

(51) Int. Cl.

| | |
|---|---|
| *H10W 72/30* | (2026.01) |
| *H10W 74/15* | (2026.01) |
| *H10W 90/00* | (2026.01) |

(56) References Cited

U.S. PATENT DOCUMENTS

| | | | | |
|---|---|---|---|---|
| 2010/0230797 | A1* | 9/2010 | Honda | H01L 23/24 257/E23.135 |
| 2018/0323128 | A1* | 11/2018 | Dias | H10W 74/117 |
| 2019/0288371 | A1* | 9/2019 | Kamgaing | H01Q 1/2283 |
| 2020/0381383 | A1* | 12/2020 | Hsu | H10W 70/05 |
| 2020/0411448 | A1* | 12/2020 | Goh | H10W 42/20 |
| 2021/0035917 | A1* | 2/2021 | Fay | H01L 23/66 |
| 2021/0233856 | A1* | 7/2021 | Dogiamis | B81B 7/0006 |
| 2022/0108954 | A1* | 4/2022 | Su | H01L 25/0655 |
| 2022/0165635 | A1* | 5/2022 | Park | H01L 23/562 |

* cited by examiner

EMI CAGE FOR MICROSTRIP ROUTING VIA DUAL LAYER UNDERFILL CONCEPT

TECHNICAL FIELD

Embodiments of the present disclosure relate to electronic packages, and more particularly to packaging architectures that include EMI shielding over microstrip routing at a surface of the package substrate.

BACKGROUND

The reduction in package layer count has been a driving force in the semiconductor packaging industry. Lower layer counts enable a reduction in Z-height as well as reducing the cost of the package substrate. However, the driver to fewer routing layers has resulted in the need to implement high speed input/output (HSIO) as a microstrip routing at the surface of the package substrate. However, microstrip routings are prone to electromagnetic interference (EMI) risks and/or radio frequency interference (RFI) risks, especially in small mobile systems.

When HSIOs are routed as a microstrip, they tend to interact with the metal stiffener (which is placed on the package substrate to mitigate warpage). This can result in an antenna effect, which further increases the EMI/RFI risk. This is particularly problematic when the stiffener is not properly grounded, as is currently the case in many packaging architectures. In order to avoid such risks, current processes including adding package layers to avoid the need for microstrip routing. However, the addition of extra layers increases cost and Z-height, which are both desired to be reduced.

EMBODIMENTS OF THE PRESENT DISCLOSURE

Figure 1A:
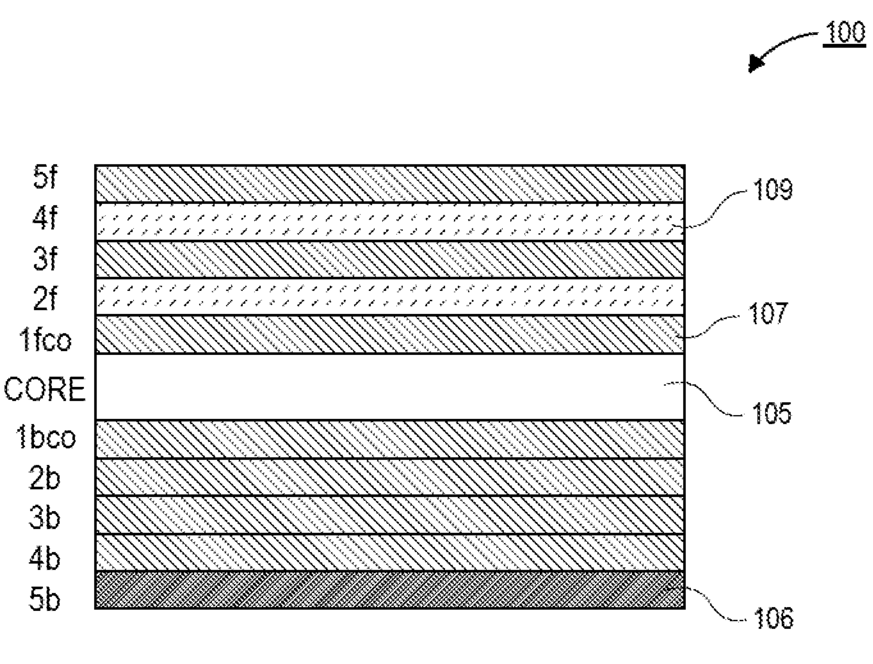
FIG. 1A is a cross-sectional illustration of a standard package substrate with a core and five layers over and under the core.

Described herein are packaging architectures that include EMI shielding over microstrip routing at a surface of the package substrate, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the movement towards lower layer counts has resulted in the need to implement HSIO signals with microstrip routing at a surface of the package substrate. Such architectures lead to problems with electromagnetic interference (EMI) and/or radio frequency interference (RFI). Accordingly, embodiments disclosed herein include the use of an EMI (and RFI) cage that covers the microstrip routing in order to mitigate unwanted interference. In some embodiments, the EMI cage also contacts the stiffener. This properly grounds the stiffener and mitigates problems with the stiffener becoming an antenna and furthering the EMI/RFI problem.

In a particular embodiment, the EMI cage is formed with a conductive epoxy or ink that is dispensed between the die and the stiffener. The addition of the conductive epoxy or ink is significantly cheaper than adding additional layers to the package substrate. In some embodiments, the conductive epoxy or ink may be dispensed with the same tool used to dispense an underfill around the first level interconnects (FLIs). As such, the cost to add the EMI cage is minimal. In addition to being a low cost solution, the EMI cage also does not increase the Z-height of the system.

In an embodiment, the EMI cage may be electrically coupled to a ground voltage. For example, a Vss pad may be exposed through a solder resist. As the conductive epoxy or ink is dispensed, the conductive epoxy or ink contacts the Vss pad in order to be electrically coupled to the ground. The grounded conductive epoxy or ink can also ground the stiffener. As such, proper shielding is provided for the microstrip routing, and EMI/RFI problems are mitigated.

Referring now to FIG. 1A, a cross-sectional illustration of a package substrate 100 is shown, in accordance with an embodiment. In an embodiment, the package substrate 100 may include a core 105. The core 105 may be a fiber reinforced (e.g., glass fiber reinforced) dielectric material. The core 105 may have a thickness between approximately 100 μm and approximately 300 μm. Though, it is to be appreciated that thinner or thicker cores may also be used. In an embodiment, routing layers may be provided above and below the core 105. In FIG. 1A, the routing layers (e.g., ground layers 107 and signal routing layers 109) are shown as being directly on top of each other. However, it is to be appreciated that dielectric buildup layers may separate the routing layers 107 and 109. Additionally, vias may pass through the buildup layers in order to couple together pads and/or traces on different layers.

In FIG. 1A, a typical ten layer package substrate 100 is shown. That is, there are five layers on the front side and five layers on the backside. The bottommost layer 106 may be bumps, balls, or the like. As is typical in the semiconductor packaging industry, the number of layers on the front side is equal to the number of layers on the backside. As such, adding a layer of signal routing 109 or a ground layer 107 results in the need to add a corresponding layer to the backside of the package substrate 100. As such, when one additional layer is needed, a total of two layers are required to be added to the package substrate 100.

In the illustration shown in FIG. 1A, the front side layers include two signal routing layers 109. The signal routing layers 109 may be sandwiched between ground layers 107. Sandwiching the signal routing layers 109 between ground layers 107 allows for the signal routing layers 109 to be properly electrically shielded. This mitigates the potential issue of EMI or RFI problems. However, as noted above, the need for the topmost ground layer 107 also requires the addition of another layer on the backside. This increases the Z-height of the package substrate 100 and the cost to manufacture the package substrate 100.

Figure 1B:
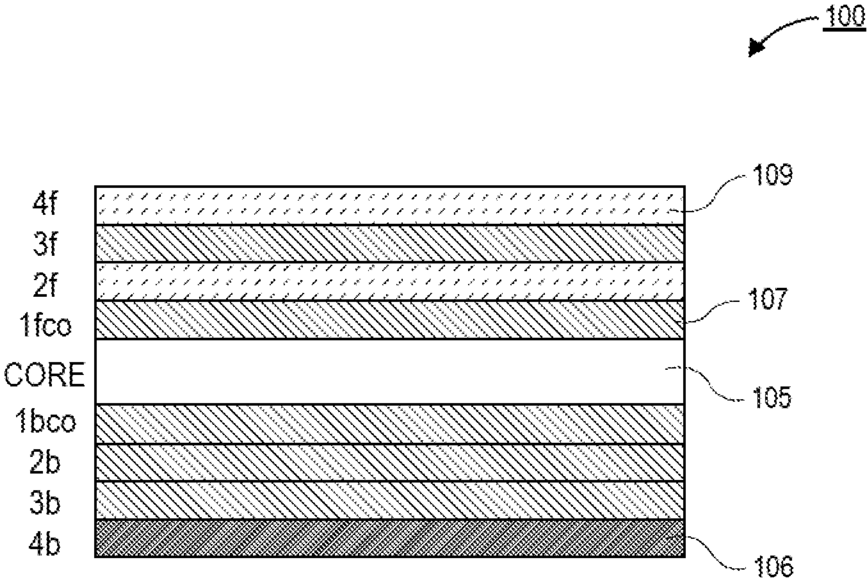
FIG. 1B is a cross-sectional illustration pf a package substrate with a core and four layers over and under the core with microstrip routing on the topmost layer of the package substrate, in accordance with an embodiment.

Accordingly, some proposals have included the option of removing the topmost ground layer 107. An example of such an embodiment is shown in FIG. 1B. As shown in FIG. 1B, the package substrate 100 includes a core 105. The core 105 may be substantially similar to the core 105 described above with respect to FIG. 1A. In an embodiment, a set of four layers may be provided above and below the core 105. That is, compared to the embodiment shown in FIG. 1A, the package substrate 100 in FIG. 1B has two fewer layers. This results in a decrease in the Z-height of the package substrate 100 and a decrease in the cost to manufacture the package substrate 100.

However, the removal of the topmost ground layer 107 results in a signal routing layer 109 being the topmost layer of the package substrate 100. While shielded below by a ground layer 107, the top side of the topmost signal routing layer 109 is now unshielded. Such an architecture (i.e., where a ground layer 107 is provide over only one surface of a signal routing layer 109) is typically referred to as a microstrip routing architecture. The use of a microstrip routing architecture typically results in an increase in EMI and/or RFI issues, due to the lack of electrical shielding on one of the surfaces (here, the top surface). As such, it may be more difficult to properly integrate other components (e.g., processors, memories, etc.) with the package substrate 100 due to the increase in interference. Furthermore, when stiffener architectures (which are typically conductive metallic structures) are added to the electronic package, the interference can be coupled to the stiffener. The stiffener may then function as an antenna that broadcasts the interference and amplifies the problem.

Therefore, embodiments disclosed herein include the use of an EMI/RFI cage in order to mitigate the interference caused by stripline routing. The EMI/RFI cage (which is sometimes referred to as a "cage" for brevity) is a grounded conductive structure that is provided over the top of the package substrate. Since the cage is grounded, the EMI and/or RFI generated by the microstrip routing can be absorbed by the cage. As such, the amount of interference can be greatly reduced or even eliminated. Since the cage does not add to the Z-height of the electronic package, the total Z-height can be reduced compared to solutions, such as the one shown in FIG. 1A. Further, the formation of the cage is done with a dispensing or sputtering process that is significantly less expensive than the addition of layers to the package substrate. Accordingly, costs can also be reduced.

Figure 2:
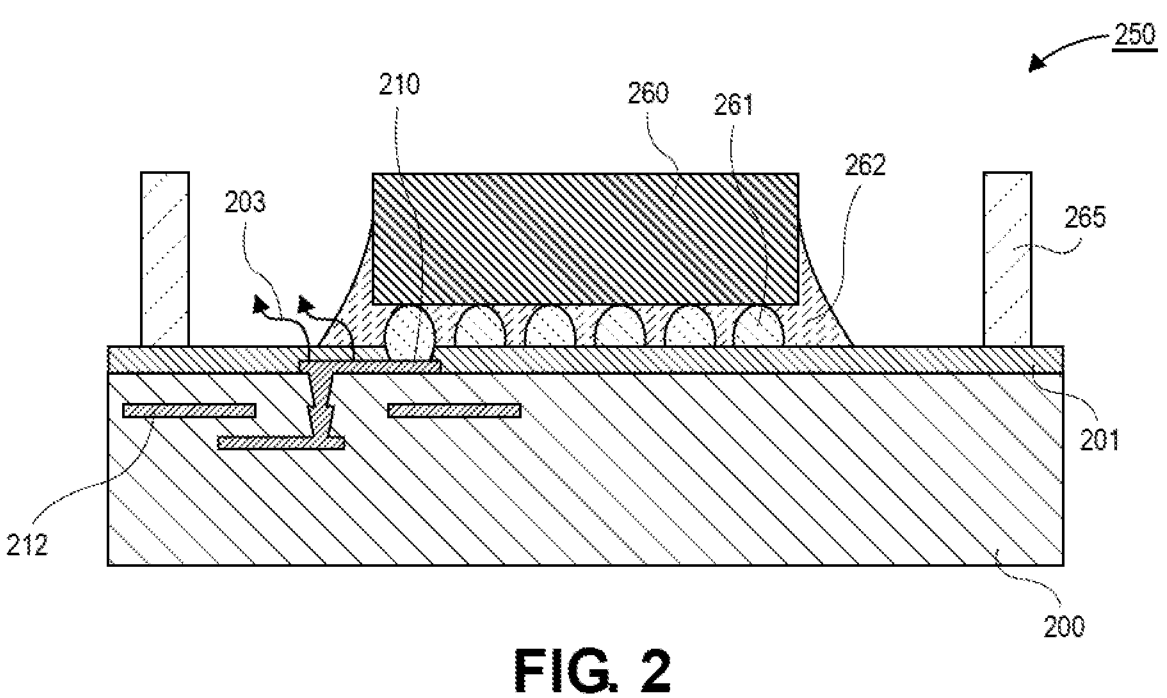
FIG. 2 is a cross-sectional illustration of an electronic package with a package substrate that includes microstrip routing on the topmost layer and suffers from EMI issues, in accordance with an embodiment.

Referring now to FIG. 2, a cross-sectional illustration of an electronic package 250 with microstrip routing on the top surface of the package substrate 200 is shown, in accordance with an embodiment. As shown, the electronic package 250 includes a package substrate 200. The package substrate 200 may include a core (not shown), and routing layers over and under the core. In a particular embodiment, the package substrate 200 may have a structure similar to the package substrate 100 shown in FIG. 1B. That is, there may be a core with four layers over the core and four layers under the core. In an embodiment, the topmost layer may be a signal routing layer 210. The layer underneath the signal routing layer 210 may be a ground layer 212. As can be appreciated, the signal routing layer 210 is in a microstrip architecture and does not include any ground above the signal routing layer 210. A solder resist layer 201 may be provided over the top surface of the package substrate 200.

In an embodiment, a die 260 may be coupled to the package substrate 200. The die 260 may be coupled to the package substrate 200 by interconnects, such as first level interconnects (FLIs) 261. The FLIs 261 may be surrounded by an underfill layer 262. The underfill layer 262 may be a capillary underfill (CUF) material. The underfill layer 262 is generally a non-conductive material, and is used to provide support to the FLIs 261. The underfill layer 262 may increase the robustness of the electronic package 250 in some embodiments.

The die 260 may be any type of die used in an electronic package 250. In a particular embodiment, the die 260 may be a central processing unit (CPU). Other examples of dies 260 may include graphics processing units (GPUs), memories, or the like. While a single die 260 is shown in FIG. 2, it is to be appreciated that any number of dies 260 may be included in the electronic package 250. Additionally, two or more dies may be coupled together by an interposer, a mold layer, or the like. The interposer may then be coupled to the package substrate 200, with an underfill layer 262 around the interconnects between the interposer and the package substrate 200.

In an additional embodiment, a stiffener 265 may be provided around the die 260. The stiffener 265 may be a ring in some embodiments, though in other embodiments the stiffener 265 may not be a complete ring. The stiffener 265 may surround an outer perimeter of the die 260. Typically, stiffeners 265 are formed with a conductive metallic material. In many instances, the stiffener 265 is not properly grounded. That is, the stiffener 265 is electrically floating. This creates problems with EMI and can potentially amplify EMI/RFI issues. As shown in FIG. 2, arrows 203 are used to indicate the presence of EMI/RFI. The EMI/RFI may result in negative impacts to the proper functioning of the die 260 and/or for the propagation of signals in the electronic package 250. As such, it is desirable to reduced or eliminate the EMI/RFI risks.

Figure 3:
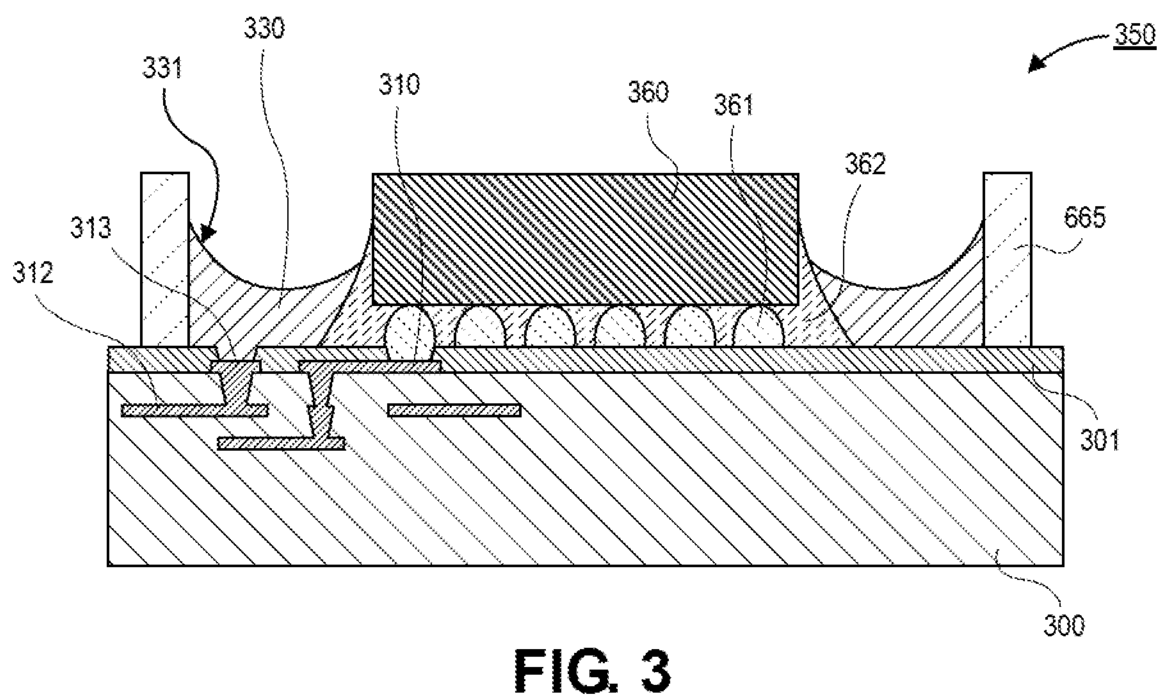
FIG. 3 is a cross-sectional illustration of an electronic package with a package substrate that includes microstrip routing on the topmost layer and where EMI issues are avoided by providing a grounded layer around the die, in accordance with an embodiment.

Referring now to FIG. 3, a cross-sectional illustration of an electronic package 350 is shown, in accordance with an embodiment. In an embodiment, the electronic package 350 may include a package substrate 300. The package substrate 300 may comprise a core (not shown) and routing layers above and below the core. The package substrate 300 may include four layers above the core and four layers below the core. For example, the package substrate 300 may be similar to the package substrate described in greater detail above with respect to FIG. 1B. As such, the topmost layer may be a signal routing layer 310, and a ground layer 312 may be provided below the signal routing layer 310. A solder resist 301 may be provided over the signal routing layer 310 in some embodiments. Since there is no ground layer 312 above the signal routing layer 310, the signal routing layer 310 may be referred to as a microstrip routing architecture. As noted above, this may result in the generation of EMI/RFI risk.

In an embodiment, the electronic package 350 may further comprise a die 360 that is coupled to the package substrate 300. For example, FLIs 361 may be provided between the die 360 and the package substrate 300. The die 360 may be any type of die, such as a CPU, a GPU, a memory, or the like. Additionally, multiple dies 360 may be provided in the electronic package 350, similar to embodiments described above. In an embodiment, an underfill layer 362 may surround the FLIs 361. The underfill layer 362 may be electrically non-conductive in order to prevent shorting between the FLIs 361. In an embodiment, the electronic package 350 may further comprise a stiffener 365. The stiffener 365 may be provided around the die 360. The stiffener 365 may be similar to the stiffener 265 described in greater detail above.

In an embodiment an electrically conductive layer 330 (or cage) may be provided over the package substrate 300. The electrically conductive layer 330 may be provided between the die 360 and the stiffener 365. In an embodiment, the electrically conductive layer 330 may comprise a conductive epoxy or a conductive ink. The electrically conductive layer 330 may contact the underfill layer 362. Additionally, the electrically conductive layer 330 may contact the stiffener 365. In an embodiment, the top surface 331 of the electrically conductive layer 330 may be curved so that a bowl like shape is provided. The curve may be the result of a curing operation, as will be described in greater detail below. In an embodiment, an outer sidewall of the electrically conductive layer 330 may conform to the shape of the stiffener 365. For example, the outer sidewall of the electrically conductive layer 330 may be substantially vertical.

In an embodiment, the electrically conductive layer 330 may be configured to be grounded. For example, the electrically conductive layer 330 may pass through the solder resist 301 and contact a pad 313. The pad 313 may be electrically coupled to a ground plane layer 312. Since the electrically conductive layer 330 is configured to be grounded, the stiffener 365 will also be grounded. Since the electrically conductive layer 330 is above the microstrip routing 310, the microstrip routing 310 becomes shielded by the overlying electrically conductive layer 330. As such, EMI/RFI risks are mitigated or completely avoided.

As will be described in greater detail below, the electrically conductive layer 330 may be formed with a dispensing or sputtering process. The cost of such processes is significantly lower than the cost of adding additional routing layers to the package substrate 300. As such costs are reduced. Additionally, it is to be appreciated that the electrically conductive layer 330 has a top surface 331 that is below top surfaces of the die 360 and the stiffener 365. Accordingly, the addition of the electrically conductive layer 330 does not result in an increase in the Z-height of the electronic package 350.

Referring now to FIGS. 4A-4D, a series of cross-sectional illustrations depicting a process for forming an electronic package 450 with an electrically conductive layer over the microstrip routing is shown, in accordance with an embodiment. In the illustrated embodiment, only the left side of the die 460 is shown for simplicity. However, it is to be appreciated that the right side of the electronic package 450 may be substantially similar to the left side.

Figure 4A:
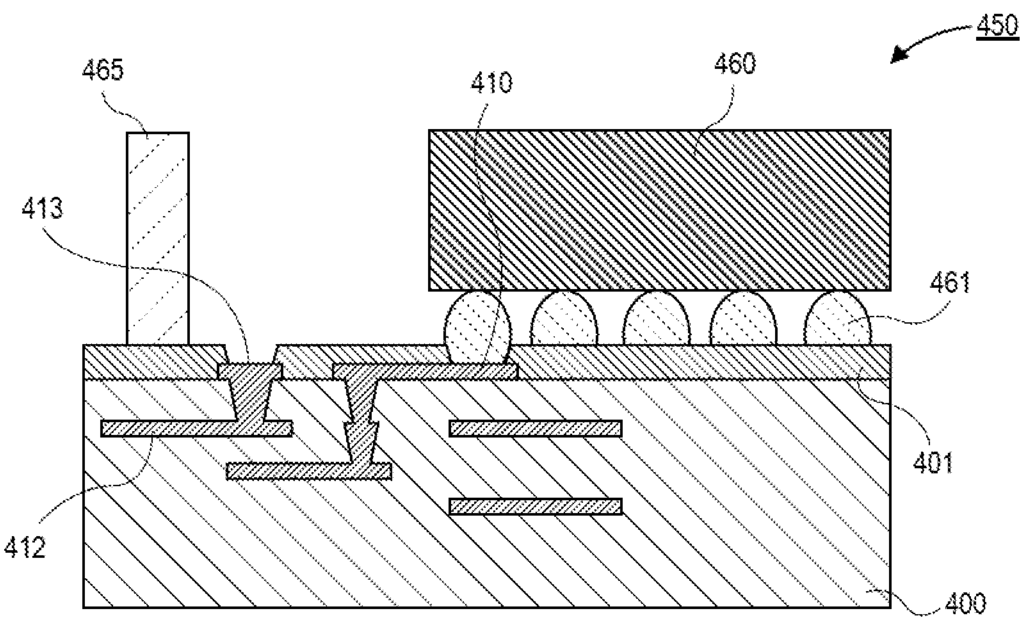
FIG. 4A is a cross-sectional illustration of an electronic package with microstrip routing on a topmost layer of the package substrate, a die, and a stiffener, in accordance with an embodiment.

Referring now to FIG. 4A, a cross-sectional illustration of an electronic package 450 is shown, in accordance with an embodiment. In an embodiment, the electronic package 450 comprises a package substrate 400. The package substrate 400 may include a core (not shown) with routing layers above and below the core. In a particular embodiment, the package substrate 400 may be substantially similar to the package substrate 100 described above with respect to FIG. 1B. As such, four routing layers may be provided above and below the core.

As shown in FIG. 4A, a signal routing layer 410 may be provided as a topmost layer, and a ground layer 412 may be provided immediately below the signal routing layer 410. In an embodiment, a ground pad 413 may be exposed through the solder resist 401. The signal routing layer 410 may be coupled to FLIs 461. The FLIs 461 may be coupled to the die 460. The die 460 may be substantially similar to any of the dies described in greater detail above. Additionally, multiple dies may be coupled to the package substrate 400 in some embodiments. In an embodiment, a stiffener 465 may be provided around a perimeter of the die 460. The stiffener 465 may be an electrically conductive material, similar to stiffeners described in greater detail above.

Figure 4B:
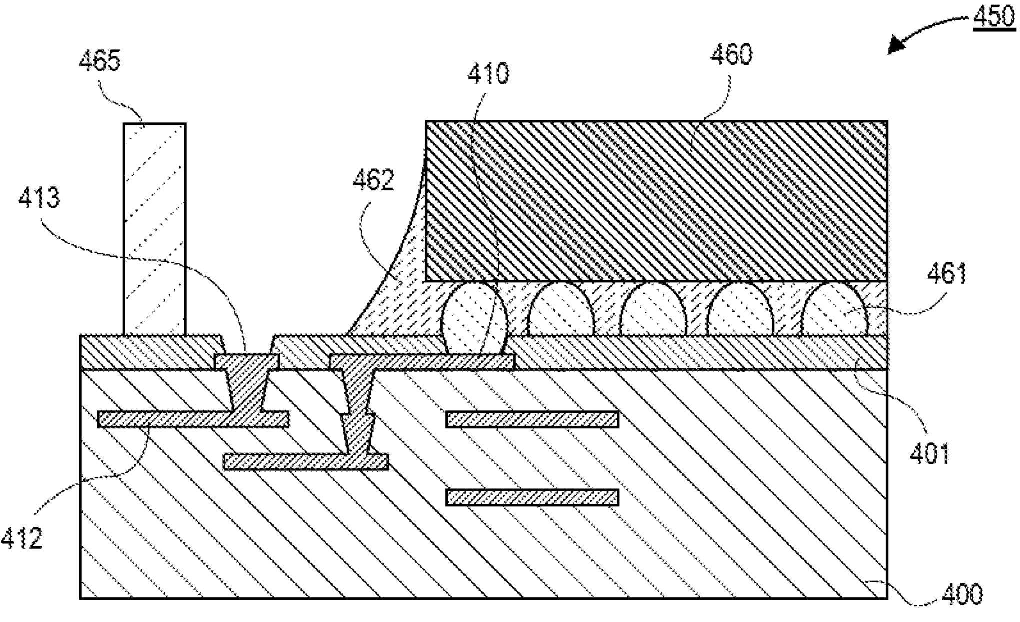
FIG. 4B is a cross-sectional illustration of the electronic package after a non-conductive underfill material is disposed around the first level interconnects (FLIs) between the die and the package substrate, in accordance with an embodiment.

Referring now to FIG. 4B, a cross-sectional illustration of the electronic package 450 after an underfill layer 462 is formed is shown, in accordance with an embodiment. In an embodiment, the underfill layer 462 may be an electrically non-conductive material. For example, the underfill layer 462 may be an epoxy or the like. In an embodiment, the underfill layer 462 may be dispensed with a nozzle (not shown). The underfill layer 462 may be a capillary underfill (CUF) material in some embodiments. The underfill layer 462 may provide mechanical support to the FLIs 461. As such, the robustness of the electronic package is improved.

In an embodiment, the underfill layer 462 may extend out past an edge of the die 460. The topmost surface of the underfill layer 462 may be below a top surface of the die 460. In an embodiment, a sidewall surface of the underfill layer 462 may be non-vertical. For example, the sidewall surface of the underfill layer 462 may be curved. An outer edge of the underfill layer 462 may be between the pad 413 and the die 460. That is, the underfill layer 462 does not cover the pad 413, and the pad 413 remains exposed after dispensing the underfill layer 462.

Figure 4C:
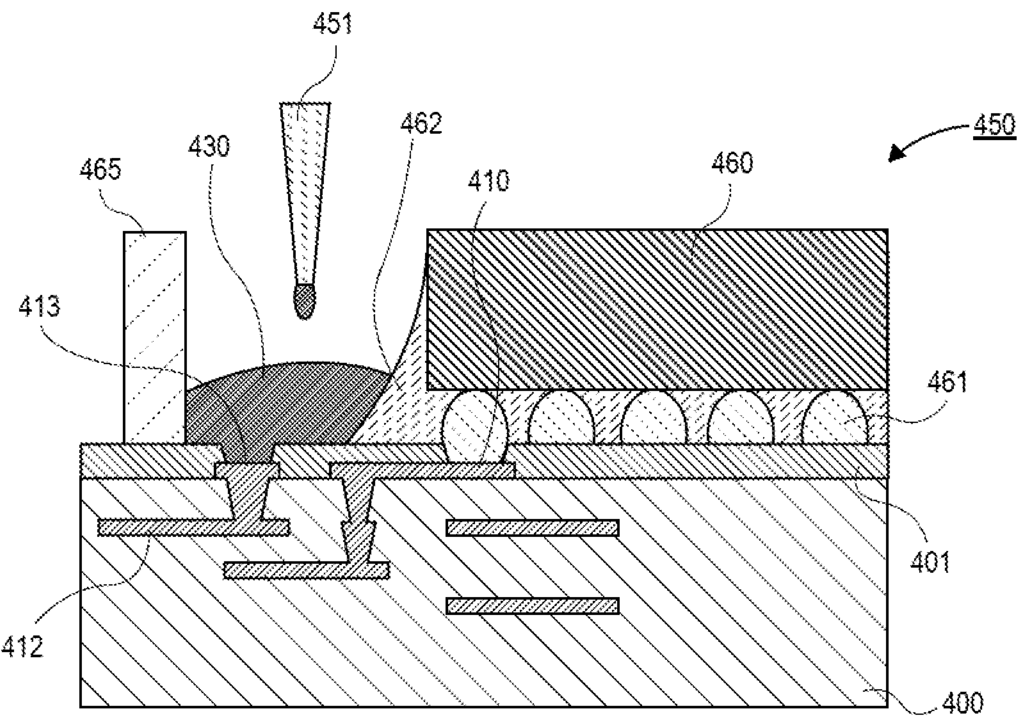
FIG. 4C is a cross-sectional illustration of the electronic package after an electrically conductive layer is disposed around the die and within a perimeter of the stiffener, in accordance with an embodiment.

Referring now to FIG. 4C, a cross-sectional illustration of the electronic package 450 after an electrically conductive layer 430 is dispensed around the die 460 is shown, in accordance with an embodiment. In a particular embodiment, the conductive layer 430 is dispensed with a nozzle 451. In some embodiments, the nozzle 451 may be the same nozzle that is used to dispense the underfill layer 462. In other embodiments, different nozzles 451 are used to dispense the underfill layer 462 and the conductive layer 430. In an embodiment, the conductive layer 430 may be an electrically conductive epoxy or the like.

The conductive layer 430 is bounded on the outside by the stiffener 465 and by the underfill layer 462 on the inside. As such, a confined area is provided in order to control the flow of the conductive layer 430. The outer sidewall of the conductive layer 430 may be conformal to the stiffener 465 (e.g., a vertical sidewall), and an inner sidewall of the conductive layer 430 may be conformal to the underfill layer 462 (e.g., curved or otherwise non-vertical). In an embodiment, the top surface of the conductive layer 430 may be curved and have a dome-like shape.

In an embodiment, the conductive layer 430 may pass through the solder resist 401 and contact the pad 413. As such, the conductive layer 430 may be configured to be electrically coupled to a ground plane 412. This allows for the microstrip routing 410 to be shielded by the conductive layer 430. Additionally, since the conductive layer 430 contacts the stiffener 465, the stiffener 465 is also configured to be properly grounded.

Figure 4D:
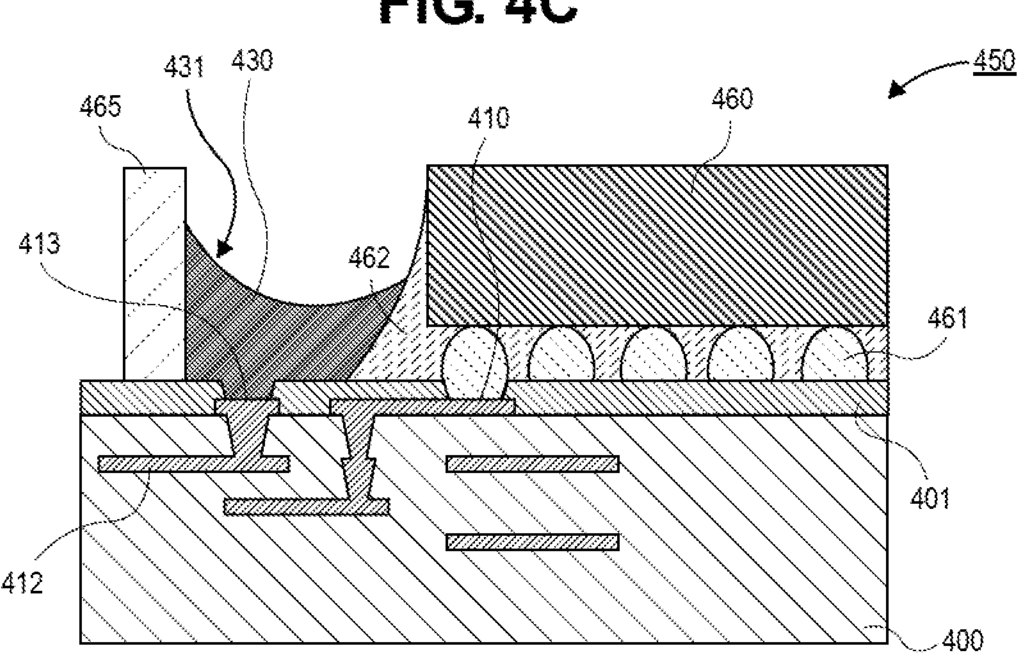
FIG. 4D is a cross-sectional illustration of the electronic package after the electrically conductive layer is cured, in accordance with an embodiment.

Referring now to FIG. 4D, a cross-sectional illustration of the electronic package 450 after a curing process is shown, in accordance with an embodiment. In an embodiment, the curing process may result in the volume of the conductive layer 430 shrinking. The reduction in volume may result in the top surface 431 of the conductive layer 430 curving in an opposite direction. For example, the top surface 431 may be bowl shaped or the like. The cured conductive layer 430 is now configured to be properly grounded in order to mitigate or eliminate EMI/RFI risk generated by the microstrip routing 410 on the top surface of the package substrate 400.

Figure 5A:
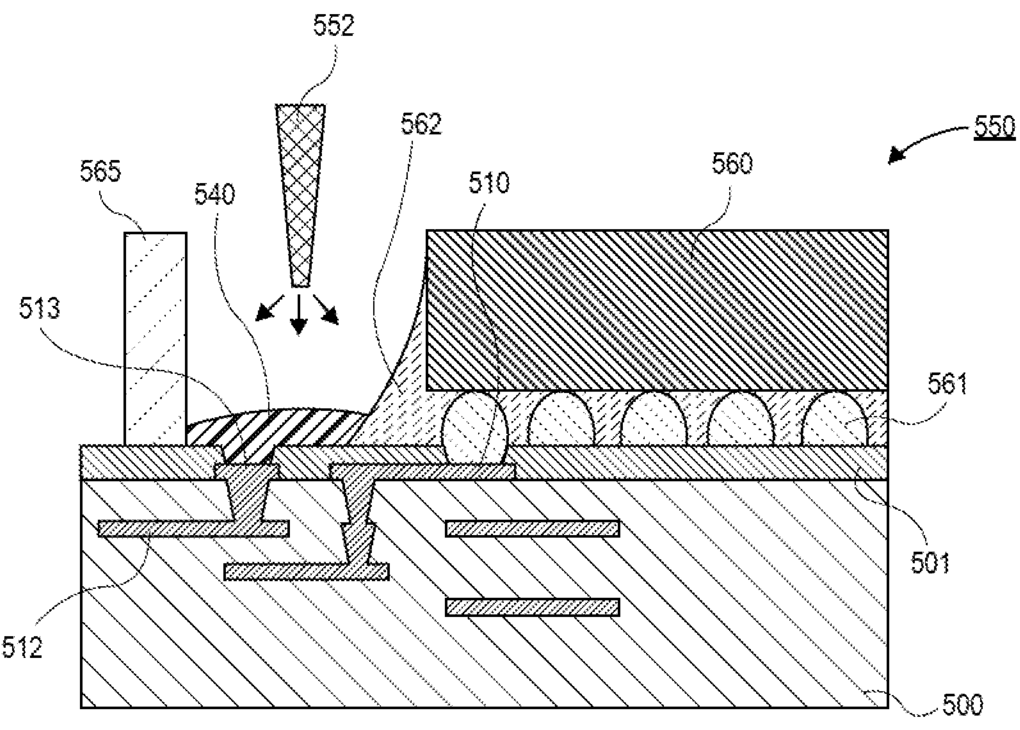
FIG. 5A is a cross-sectional illustration of an electronic package with an electrically conductive layer dispensed around the die and within a perimeter of the stiffener, in accordance with an embodiment.
Figure 5B:
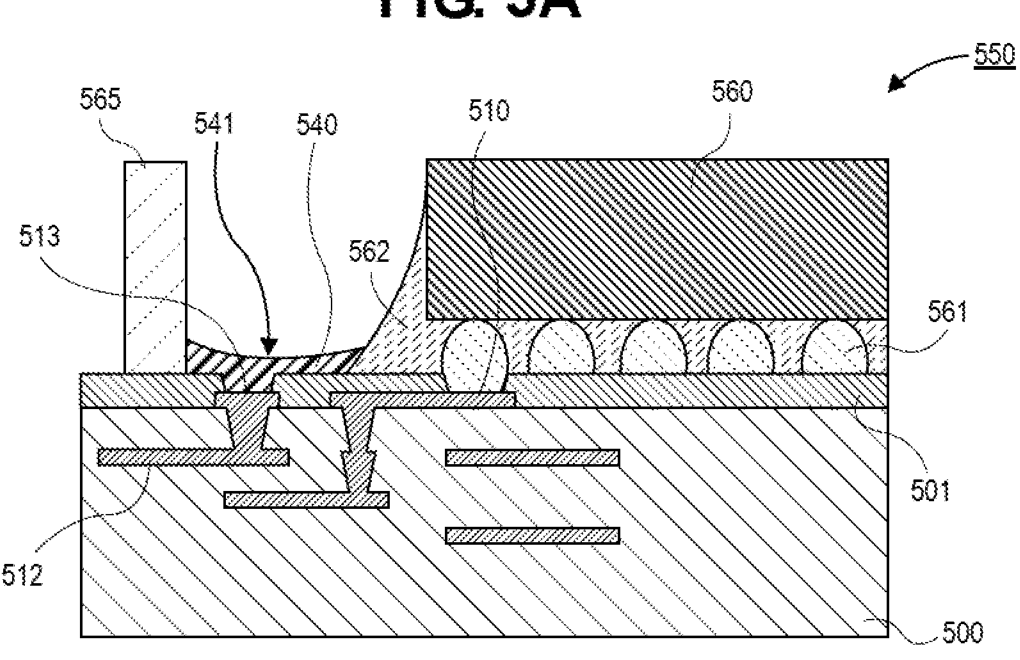
FIG. 5B is a cross-sectional illustration of the electronic package after the electrically conductive layer is cured, in accordance with an embodiment.

Referring now to FIGS. 5A and 5B, cross-sectional illustrations depicting the process of forming an electrically conductive layer over microstrip routing is shown, in accordance with an embodiment. In FIGS. 5A and 5B a deposition process and material type that is used to form the conductive layer may be different than those used in FIGS. 4A-4D. FIG. 5A starts with the deposition of the electrically conductive layer 540. Processing operations up to that point may be substantially similar to those described above with respect to FIGS. 4A and 4B.

Referring now to FIG. 5A, a cross-sectional illustration of an electronic package 550 is shown, in accordance with an embodiment. In an embodiment, the electronic package 550 may comprise a package substrate 500. The package substrate 500 may include a core (not shown) with routing layers above and below the core. In a particular embodiment, the package substrate 500 may be substantially similar to the package substrate 100 described above with respect to FIG. 1B. As such, four routing layers may be provided above and below the core.

As shown in FIG. 5A, a signal routing layer 510 may be provided as a topmost layer, and a ground layer 512 may be provided immediately below the signal routing layer 510. In an embodiment, a ground pad 513 may be exposed through the solder resist 501. The signal routing layer 510 may be coupled to FLIs 561. The FLIs 561 may be coupled to the die 560. In an embodiment, an underfill layer 562 may be provided around the FLIs 561. The die 560 may be substantially similar to any of the dies described in greater detail above. Additionally, multiple dies may be coupled to the package substrate 500 in some embodiments. In an embodiment, a stiffener 565 may be provided around a perimeter of the die 560. The stiffener 565 may be an electrically conductive material, similar to stiffeners described in greater detail above.

In an embodiment, deposition tool 552 may be used to deposit an electrically conductive layer 540 between the stiffener 565 and the underfill layer 562. The deposition tool 552 may be a nozzle in some embodiments. In other embodiments, the deposition tool 552 may be a sputtering tool or other similar deposition tool. In a particular embodiment, the conductive layer 540 is an electrically conductive ink or the like. As shown, the conductive layer 540 has a vertical outer sidewall (conformal to the stiffener 565), and a non-vertical inner sidewall (conformal to the underfill layer 562). A top surface of the conductive layer 540 may be curved (e.g., domed shaped). In an embodiment, the conductive layer 540 may pass through the solder resist 501 in order to contact the grounded pad 513.

Referring now to FIG. 5B, a cross-sectional illustration of the electronic package 550 after a curing process is shown, in accordance with an embodiment. In an embodiment, the curing process may result in the volume of the conductive layer 540 shrinking. The reduction in volume may result in the top surface 541 of the conductive layer 540 curving in an opposite direction. For example, the top surface 541 may be bowl shaped or the like. The cured conductive layer 540 is now configured to be properly grounded in order to mitigate or eliminate EMI/RFI risk generated by the microstrip routing 510 on the top surface of the package substrate 500.

Figure 6:
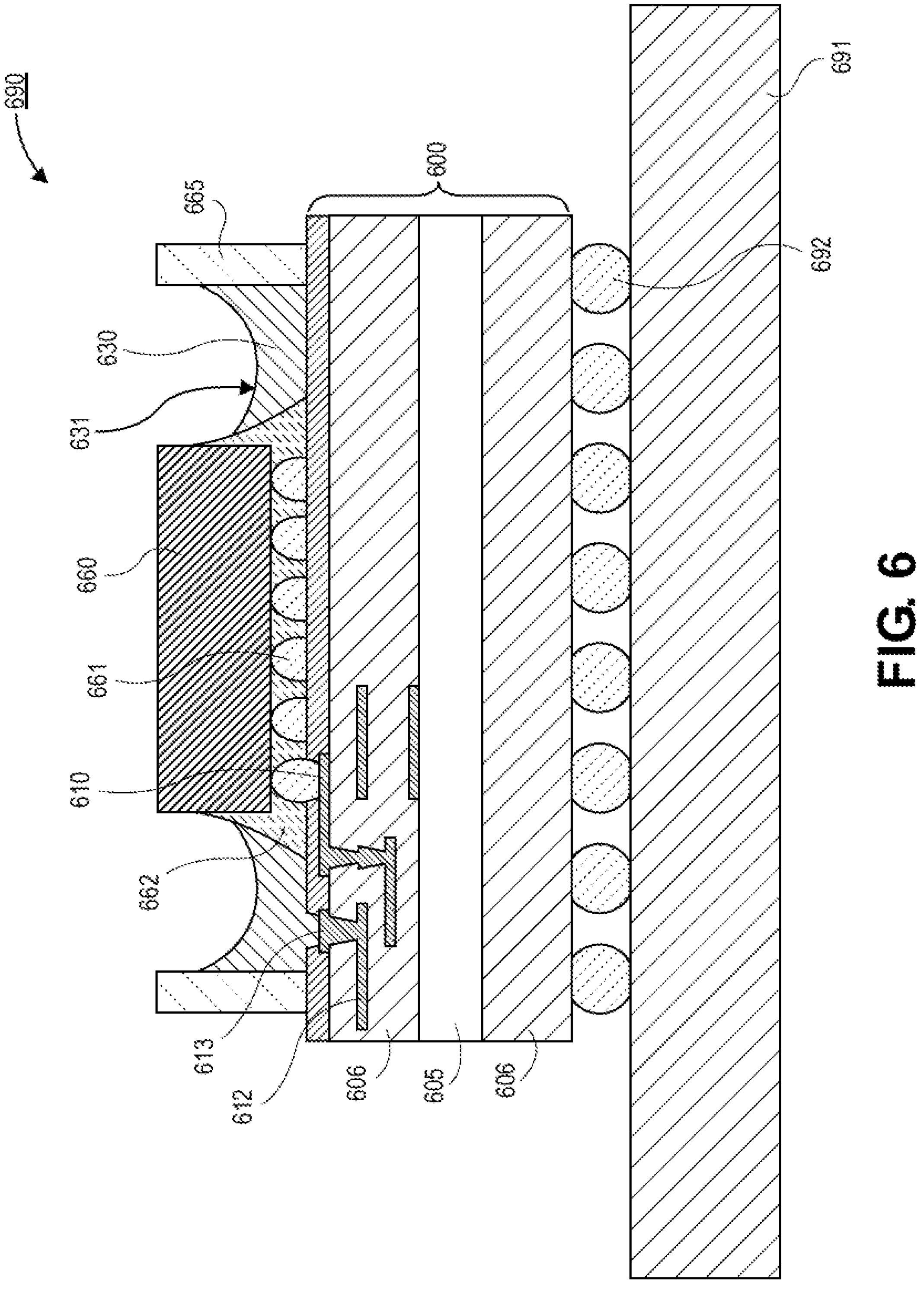
FIG. 6 is a cross-sectional illustration of an electronic system with a package substrate that includes microstrip routing and an electrically conductive layer over the microstrip routing in order to mitigate EMI issues, in accordance with an embodiment.

Referring now to FIG. 6, a cross-sectional illustration of an electronic system 690 is shown, in accordance with an embodiment. In an embodiment, the electronic system 690 may comprise a board 691, such as a printed circuit board (PCB). The board 691 may be coupled to a package substrate 600 by interconnects 692. While solder balls are shown as the interconnects 692, it is to be appreciated that any suitable interconnect architecture may be used.

In an embodiment, the package substrate 600 may comprise a core 605 with buildup layers 606 over and under the core 605. Routing layers may be provided in the buildup layers 606. For example, four routing layers are illustrated in the top buildup layers 606. In an embodiment, the topmost routing layer 610 may be a signal routing layer, and the layer immediately under the routing layer 610 may be a ground layer 612. As such, the topmost routing layer 610 may be referred to as having a microstrip routing architecture.

In an embodiment, a die 660 may be coupled to the package substrate 600 by FLIs 661. The FLIs 661 may be surrounded by an underfill layer 662. In an embodiment, a stiffener 665 may be over the package substrate 600 and surround the die 660. In an embodiment, a conductive layer 630 is provided between the die 660 and the stiffener 665. The conductive layer 630 may be configured to be grounded. For example, the conductive layer 630 may contact a pad 613 that is coupled to the ground plane 612. As such, a grounded feature is provided over the topmost routing layer 610 in order to provide proper electrical shielding to mitigate or eliminate EMI/RFI risks.

Figure 7:
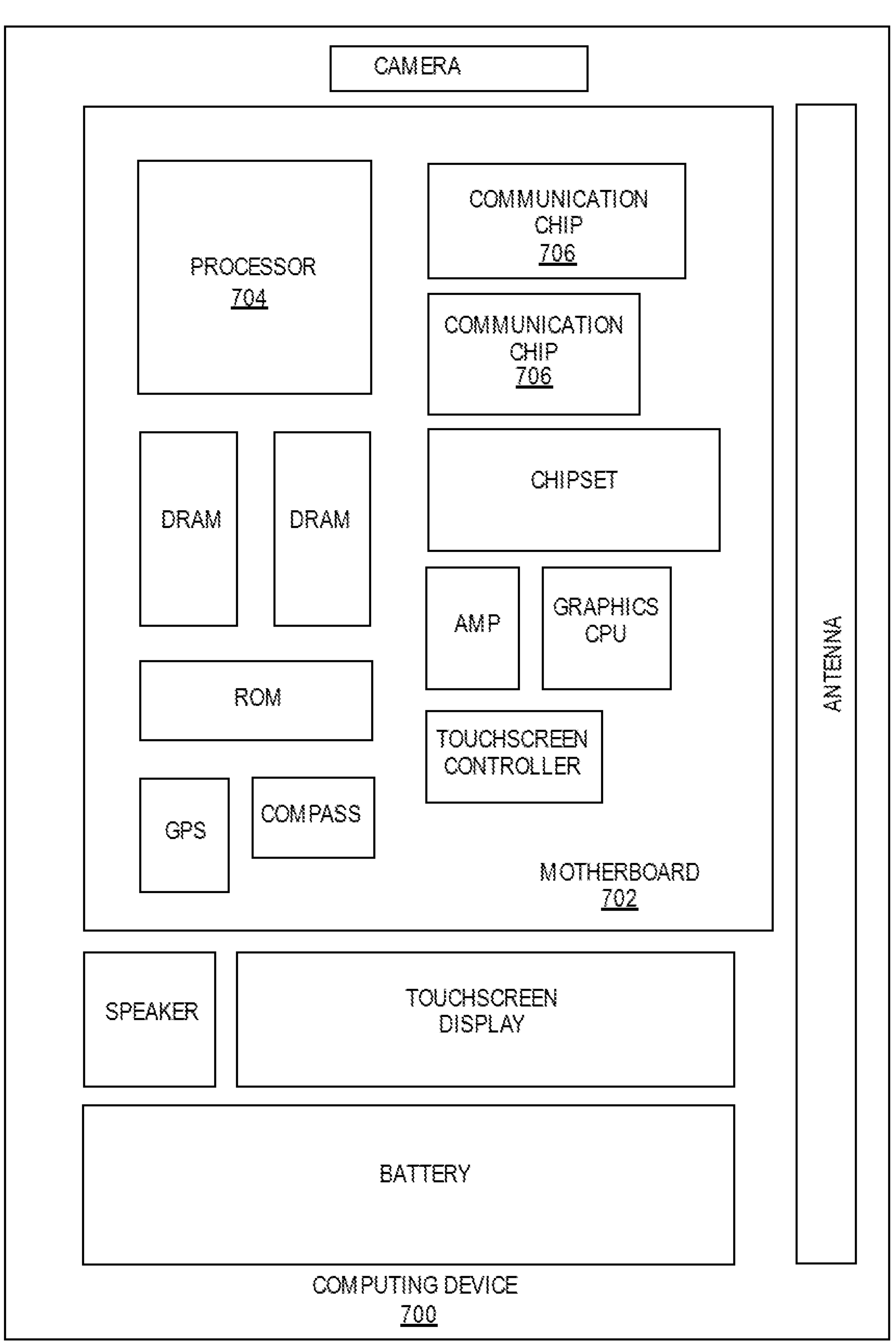
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be part of an electronic system that comprises an electrically conductive layer that is configured to be grounded over a microstrip routing layer, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be part of an electronic system that comprises an electrically conductive layer that is configured to be grounded over a microstrip routing layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a package substrate; a die coupled to the package substrate; a stiffener around the die and over the package substrate; an electrically non-conductive underfill around first level interconnects (FLIs) between the package substrate and the die; and an electrically conductive layer around the non-conductive underfill.

Example 2: the electronic package of Example 1, wherein the electrically conductive layer contacts the stiffener.

Example 3: the electronic package of Example 1 or Example 2, further comprising: a pad on the package substrate, and wherein the electrically conductive layer contacts the pad.

Example 4: the electronic package of Example 3, wherein the pad is configured to be grounded.

Example 5: the electronic package of Examples 1-4, wherein a top surface of the electrically conductive layer is curved.

Example 6: the electronic package of Examples 1-5, wherein the electrically conductive layer is a conductive epoxy.

Example 7: the electronic package of Examples 1-5, wherein the electrically conductive layer is a conductive ink.

Example 8: the electronic package of Examples 1-7, wherein the package substrate comprises a core with a first four layers over the core and a second four layers under the core.

Example 9: the electronic package of Example 8, wherein a topmost layer of the first four layers is a signal routing layer, and wherein a layer directly under the topmost layer is a ground layer.

Example 10: the electronic package of Example 9, wherein the signal routing layer is a microstrip.

Example 11: the electronic package of Example 10, wherein the electrically conductive layer electrically shields the microstrip.

Example 12: a method of forming an electronic package, comprising: providing a die and a stiffener over a package substrate; dispensing an underfill under the die around first level interconnects (FLIs); dispensing an electrically conductive layer around the underfill; and curing the electrically conductive layer.

Example 13: the method of Example 12, wherein the electrically conductive layer contacts the stiffener.

Example 14: the method of Example 12 or Example 13, wherein the electrically conductive layer contacts a ground pad on the package substrate.

Example 15: the method of Examples 12-14, wherein the electrically conductive layer is a conductive epoxy.

Example 16: the method of Example 15, wherein the conductive epoxy and the underfill are dispensed with the same nozzle.

Example 17: the method of Examples 12-16, wherein the electrically conductive layer is a conductive ink.

Example 18: the method of Examples 12-17, wherein the package substrate comprises a core and four layers above the core and four layers below the core.

Example 19: the method of Example 18, wherein a microstrip routing is provided on a topmost layer of the package substrate.

Example 20: the method of Example 19, wherein the electrically conductive layer electrically shields the microstrip routing.

Example 21: the method of Examples 12-20, wherein the curing results in a top surface of the electrically conductive layer being curved.

Example 22: an electronic system, comprising: a board; a package substrate coupled to the board; a die coupled to the package substrate; an underfill around first level interconnects (FLIs) between the die and the package substrate; and an electromagnetic interference (EMI) shield over the package substrate and around the underfill.

Example 23: the electronic system of Example 22, wherein the EMI shield includes a conductive epoxy or a conductive ink.

Example 24: the electronic system of Example 22 or Example 23, wherein the EMI shield is configured to be grounded.

Example 25: the electronic system of Examples 22-24, further comprising: a stiffener on the package substrate and around the die, wherein the EMI shield contacts the stiffener.

What is claimed is:

1. An electronic package, comprising:

a package substrate;

a die coupled to the package substrate;

a stiffener around the die and over the package substrate;

an electrically non-conductive underfill around first level interconnects (FLIs) between the package substrate and the die; and an electrically conductive layer around the non-conductive underfill, wherein the non- conductive underfill is laterally intervening between the die and the electrically conductive layer such that the electrically conductive layer does not contact the die, and wherein the electrically conductive layer contacts the stiffener.

2. The electronic package of claim 1, further comprising:

a pad on the package substrate, and wherein the electrically conductive layer contacts the pad.

3. The electronic package of claim 2, wherein the pad is configured to be grounded.

4. The electronic package of claim 1, wherein a top surface of the electrically conductive layer is curved.

5. The electronic package of claim 1, wherein the electrically conductive layer is a conductive epoxy.

6. The electronic package of claim 1, wherein the electrically conductive layer is a conductive ink.

7. The electronic package of claim 1, wherein the package substrate comprises a core with a first four layers over the core and a second four layers under the core.

8. The electronic package of claim 7, wherein a topmost layer of the first four layers is a signal routing layer, and wherein a layer directly under the topmost layer is a ground layer.

9. The electronic package of claim 8, wherein the signal routing layer is a microstrip.

10. The electronic package of claim 9, wherein the electrically conductive layer electrically shields the microstrip.

11. A method of forming an electronic package, comprising:

providing a die and a stiffener over a package substrate;

dispensing an underfill under the die around first level interconnects (FLIs);

dispensing an electrically conductive layer around the underfill; and curing the electrically conductive layer, wherein the underfill is laterally intervening between the die and the electrically conductive layer such that the electrically conductive layer does not contact the die, and wherein the electrically conductive layer contacts the stiffener.

12. The method of claim 11, wherein the electrically conductive layer contacts a ground pad on the package substrate.

13. The method of claim 11, wherein the electrically conductive layer is a conductive epoxy.

14. The method of claim 13, wherein the conductive epoxy and the underfill are dispensed with the same nozzle.

15. The method of claim 11, wherein the electrically conductive layer is a conductive ink.

16. The method of claim 11, wherein the package substrate comprises a core and four layers above the core and four layers below the core.

17. The method of claim 16, wherein a microstrip routing is provided on a topmost layer of the package substrate.

18. The method of claim 17, wherein the electrically conductive layer electrically shields the microstrip routing.

19. The method of claim 11, wherein the curing results in a top surface of the electrically conductive layer being curved.

20. An electronic system, comprising:

a board;

a package substrate coupled to the board;

a die coupled to the package substrate;

an underfill around first level interconnects (FLIs) between the die and the package substrate;

an electromagnetic interference (EMI) shield over the package substrate and around the underfill, wherein the underfill is laterally intervening between the die and the EMI shield such that the EMI shield does not contact the die; and a stiffener on the package substrate and around the die, wherein the EMI shield contacts the stiffener.

21. The electronic system of claim 20, wherein the EMI shield includes a conductive epoxy or a conductive ink.

22. The electronic system of claim 20, wherein the EMI shield is configured to be grounded.

* * * * *